United States Patent [19]

Isshiki et al.

[11] Patent Number: 4,757,509
[45] Date of Patent: Jul. 12, 1988

[54] SEMICONDUCTOR LASER APPARATUS

[75] Inventors: Kunihiko Isshiki; Wataru Susaki, both of Itami, Japan

[73] Assignee: Mitsubishi Denki Kabushiki Kaisha, Tokyo, Japan

[21] Appl. No.: 888,398

[22] Filed: Jul. 23, 1986

[30] Foreign Application Priority Data

Jul. 25, 1985 [JP] Japan .................................. 60-166607

[51] Int. Cl.$^4$ ................................................ H01S 3/19
[52] U.S. Cl. ........................................ 372/45; 372/46
[58] Field of Search .................................... 372/45, 46

[56] References Cited

U.S. PATENT DOCUMENTS 4,185,256  1/1980  Scifres et al. ........................ 372/45
4,506,366  3/1985  Chinone et al. ..................... 372/46

OTHER PUBLICATIONS

"A New Transverse-Mode Stabilized GaAlAs Laser with a Slab-Coupled Waveguide Grown by MOCVD", Extended Abstracts of the 16th (1984 International) Conference on Solid State Devices and Materials, Kobe, pp. 153-156.

Primary Examiner—James W. Davie
Assistant Examiner—Xuan T. Vo
Attorney, Agent, or Firm—Lowe, Price, LeBlanc, Becker & Shur

[57] ABSTRACT

Laser light guided by a coupled waveguide (formed by difference in refractive index between n-type and p-type AlGaAs clad layers (2) and (4) and an undoped AlGaAs active layer (3) and difference in refractive index between the p-type AlGaAs clad layers (4) and (7) and a p-type AlGaAs waveguide layer (6)) is guided only by the p-type AlGaAs waveguide layer (6) in the vicinity of end surfaces (40, 42), not to be coupled with the undoped AlGaAs active layer (3). Therefore, surface regions of the end surfaces (40, 42) reflecting the laser light are formed by the p-type AlGaAs clad layers (4, 7) and the p-type AlGaAs waveguide layer (6) being larger in forbidden bandwidth.

11 Claims, 3 Drawing Sheets

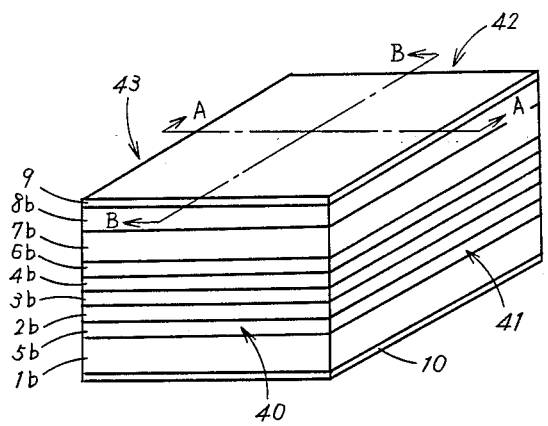
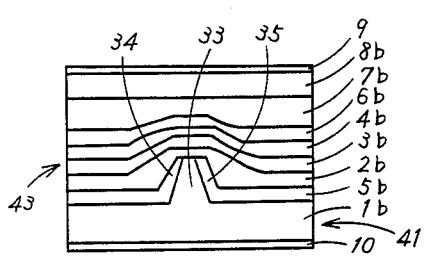
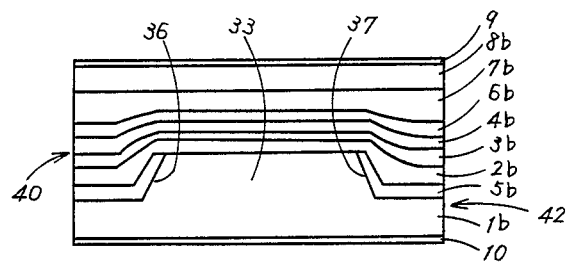

SEMICONDUCTOR LASER APPARATUS

BACKGROUND OF THE INVENTION

1. Field of the Invention

The present invention relates to a semiconductor laser apparatus, and more particularly, to a semiconductor laser apparatus which has a NAM (nonabsorbing mirror) structure for providing a high-output semiconductor laser of high reliability.

2. Description of the Prior Art

FIG. 7 is a sectional view showing a conventional semiconductor laser apparatus having a coupled waveguide disclosed in, for example, '37 A New Transverse-Mode Stabilized GaAlAs Laser with a Slab-Coupled Waveguide Grown by MOCVD", Extended Abstracts of the 16th (1984) International Conference on Solid State Devices and Materials, Kobe, pp. 153–156. The structure of this semiconductor laser apparatus will now be described. Referring to FIG. 7, an n-type GaAs substrate 1a is provided thereon with an n-type AlGaAs clad layer 2a (composition ratio of Al to Ga is, e.g., 45% : 55%), an undoped AlGaAs active layer 3a (composition ratio of Al to Ga is, e.g., 9% : 91%), a p-type AlGaAs clad layer 4a (composition ratio of Al to Ga is, e.g., 45% : 55%) and an n-type GaAs current blocking layer 5 in the said order, and a stripe channel 20a is formed on the p-type AlGaAs clad layer 4a and the n-type GaAs current blocking layer 5. Further, a p-type AlGaAs waveguide layer 6 (composition ratio of Al to Ga is, e.g., 35% : 65%), a p-type AlGaAs clad layer (composition ratio of Al to Ga is, e.g., 45% : 55%) and a p-type GaAs contact layer 8 are formed in the said order partially on the p-type AlGaAs clad layer 4a and on the n-type GaAs current blocking layer 5, and another stripe channel is formed on the p-type AlGaAs waveguide layer 6 and the p-type AlGaAs clad layer 7 correspondingly to the strip channel 20a. An upper electrode 9 is formed on the p-type GaAs contact layer 8 and a lower electrode 10 is formed under the n-type GaAs substrate 1a.

A method of manufacturing the semiconductor laser apparatus as shown in FIG. 7 will now be described. The said layers from the n-type AlGaAs clad layer 2a to the n-type GaAs current blocking layer 5 are epitaxially grown successively on the n-type GaAs substrate 1a by a chemical vapor deposition method called as an MO-CVD (metalorganic chemical vapor deposition) method. Then an open stripe resist mask is formed on the n-type GaAs current blocking layer 5 through photolithography. Thereafter the p-type AlGaAs clad layer 4a and the n-type GaAs current blocking layer 5 are chemically etched by a vitriolic etching solution or the like through use of the resist mask, to form the stripe channel 20a. In this case, the etching time is so controlled that the bottom portion of the stripe channel 20a is separated by 0.3 to 0.5 μm from the undoped AlGaAs active layer 3a. Then the said layers from the p-type AlGaAs waveguide layer 6 to the p-type GaAs contact layer 8 are epitaxially grown partially on the p-type AlGaAs clad layer 4a and on the n-type GaAs current blocking layer 5 again by the MO-CVD method. Finally the n-type GaAs substrate 1a is polished to about 100 μm in thickness for facilitating cleavage, and the upper and lower electrodes 9 and 10 are formed on the p-type GaAs contact layer 8 and under the n-type GaAs substrate 1a respectively.

Description follows on the operation of the semiconductor laser apparatus as shown in FIG. 7. When voltage is applied between the upper and lower electrodes 9 and 10 forwardly to a p-n junction formed in the interface between the undoped AlGaAs active layer 3a and the p-type AlGaAs clad layer 4a, a forward current through a region of the stripe channel 20a, from which the n-type GaAs current blocking layer 5 is removed, is injected into the undoped AlGaAs active layer 3a to cause light emission. The light is guided by a coupled waveguide defined by difference in refractive index between the n-type and p-type AlGaAs clad layers 2a and 4a and the undoped AlGaAs active layer 3a and a difference in refractive index between the p-type AlGaAs clad layers 4a and 7 and the p-type AlGaAs waveguide layer 6. The p-type AlGaAs waveguide layer 6 is bent by the stripe channel 20a, whereby a horizontal difference in refractive index is effectively caused in the growth layers, to stabilize the transverse mode. The light guided by such a coupled waveguide is applied to laser oscillation by a Fabry-Perot type resonator formed by opposite cleavage end planes perpendicular to the longitudinal direction (perpendicular to the figure) of the stripe channel 20a.

In the conventional AlGaAs semiconductor laser apparatus, the cleavage end planes serve as regions for absorbing laser light due to the surface states. Thus, the maximum optical output is defined by COD (catastrophic optical damage) at the cleavage end planes, whereby high output operation is restricted. Further, reliability of the semiconductor laser apparatus is damaged by gradual degradation (e.g., degradation in optical output-to-current characteristics) caused by oxidation of the cleavage end planes facilitated by heat generation upon absorption of the laser light.

SUMMARY OF THE INVENTION

The present invention has been proposed to overcome the aforementioned disadvantages of the prior art, and an object thereof is to provide a semiconductor laser apparatus which is in NAM (nonabsorbing mirror) structure capable of high-output operation with high reliability.

Briefly stated, the present invention provides a semiconductor laser apparatus which has a coupled waveguide defined by a difference in refractive index between first and second semiconductor clad layers of first and second conductivity types and a semiconductor active layer and a difference in refractive index between the second and third semiconductor clad layers of the second conductivity type and a semiconductor waveguide layer, wherein the semiconductor active layer is separated from the semiconductor waveguide layer in the vicinity of laser light outgoing end planes.

According to the present invention, the semiconductor active layer is so separated from the semiconductor waveguide layer as to define no coupled waveguide, whereby the laser light guided in the inner coupled waveguide is guided by the semiconductor waveguide layer in the vicinity of the outgoing end planes, not to be coupled with the semiconductor active layer. Thus, the laser light is reflected by surface regions of the second and third semiconductor clad layers and the semiconductor waveguide layer, whereby the desired NAM structure is obtained. Accordingly, a semiconductor laser apparatus which can perform high-output operation with high reliability is obtained.

These and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a fragmented perspective view showing a semiconductor laser apparatus according to another embodiment of the present invention;

FIG. 5 is a sectional view taken along the line A—A in FIG. 4;

FIG. 6 is a sectional view taken along the line B—B in FIG. 4; and

DESCRIPTION OF THE PREFERRED EMBODIMENTS

Preferred embodiments of the present invention are now described. In the following description, explanation is omitted, where appropriate with respect to parts identical to those of the conventional apparatus as hereinabove described.

Figure 1:
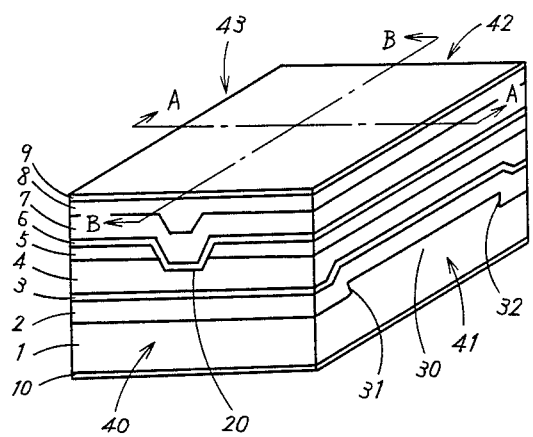
FIG. 1 is a fragmented perspective view showing a semiconductor laser apparatus having a coupled waveguide according to an embodiment of the present invention.
Figure 2:
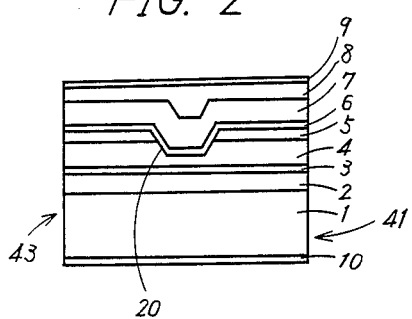
FIG. 2 is a sectional view taken along the line A—A in FIG. 1.
Figure 3:
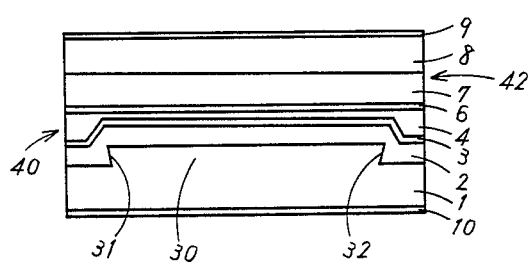
FIG. 3 is a sectional view taken along the line B—B in FIG. 1.

FIG. 1 is a fragmented perspective view showing a semiconductor laser apparatus having a coupled waveguide according to an embodiment of the present invention. FIG. 2 is a sectional view taken along the line A—A in FIG. 1 and FIG. 3 is a sectional view taken along the line B—B in FIG. 1.

Description of the structure of the semiconductor laser apparatus follows. Referring to FIGS. 1 to 3, the semiconductor laser apparatus has a pair of opposite end surfaces 40 and 42 and another pair of opposite end surfaces 41 and 43. An n-type GaAs substrate 1 is provided with a step 31 separated from the end surface 40 and another step 32 separated from the end surface 42, whereby a flat raised portion 30 is defined in the n-type GaAs substrate 1.

The n-type GaAs substrate 1 is provided thereon with an n-type AlGaAs clad layer 2 (composition ratio of Al to Ga is, e.g. 45% : 55%), an undoped AlGaAs active layer 3 (composition ratio of Al to Ga is, e.g., 9% : 91%), a p-type AlGaAs clad layer 4 (composition ratio of Al to Ga is, e.g., 45% : 55%) and an n-type GaAs current blocking layer 5 in the said order, and a stripe channel 20 is formed on the p-type AlGaAs clad layer 4 and the n-type GaAs current blocking layer 5. The n-type AlGaAs clad layer 2 and the p-type AlGaAs clad layer 4 are respectively larger in forbidden bandwidth than the undoped AlGaAs active layer 3.

A p-type AlGaAs waveguide layer 6 (composition ratio of Al to Ga is, e.g., 35% : 65%), a p-type AlGaAs clad layer 7 (composition ratio of Al to Ga is, e.g., 45% : 55%) and a p-type GaAs contact layer 8 are formed in the said order partially on the p-type AlGaAs clad layer 4 and on the n-type GaAs current blocking layer 5, and another stripe channel is formed on the p-type AlGaAs waveguide layer 6 and the p-type AlGaAs clad layer 7 correspondingly to the stripe channel 20. The p-type AlGaAs waveguide layer 6 has a larger forbidden bandwidth than the undoped AlGaAs active layer 3 and smaller than the p-type AlGaAs clad layer 4 and the p-type AlGaAs clad layer 7 has a larger forbidden bandwidth than the p-type AlGaAs waveguide layer 6. The undoped AlGaAs active layer 3 is bent in portions obliquely above the steps 31 and 32, whereby the space between the undoped AlGaAs active layer 3 and the p-type AlGaAs waveguide layer 6 is narrower in a portion above the flat raised portion 30 and wider in portions close to the end surfaces 40 and 42.

Figure 7:
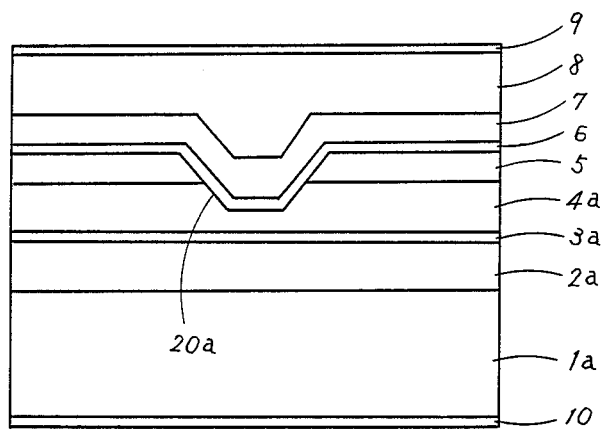
FIG. 7 is a sectional view showing a conventional semiconductor laser apparatus having a coupled waveguide.

The end surfaces 40 and 42 serve as laser light outgoing planes, and are formed by cleavage planes for reflecting the light. Similarly to the conventional apparatus as shown in FIG. 7, an upper metal electrode 9 is formed on the p-type GaAs contact layer 8 and a lower metal electrode 10 is formed under the n-type GaAs substrate 1.

A method of manufacturing the semiconductor laser apparatus of this embodiment is generally similar to that of manufacturing the conventional semiconductor laser apparatus, except for the fact that the n-type GaAs substrate 1 has the flat raised portion 30. The flat raised portion 30 can be formed by performing selective chemical etching in the vicinity of the end surfaces 40 and 42 of the n-type GaAs substrate 1 through photolithography.

Description follows on the operation of the semiconductor laser apparatus according to this embodiment. This semiconductor laser apparatus is substantially identical in operating mechanism to the conventional semiconductor laser apparatus, and a coupled waveguide is defined by a difference in refractive index between the n-type and p-type AlGaAs clad layers 2 and 4 and the undoped AlGaAs active layer 3 and a difference in refractive index between the p-type clad layers 4 and 7 and the p-type AlGaAs waveguide layer 6. However, the undoped AlGaAs active layer 3 is bent in the portions obliquely above the steps 31 and 32 to be separated from the p-type AlGaAs waveguide layer 6 in the vicinity of the end surfaces 40 and 42, whereby no coupled waveguide is defined in portions close to the end surfaces 40 and 42. This is because light goes straight ahead and substantially no light is transmitted through the bent portions of the undoped AlGaAs active layer 3. Therefore, laser light guided by the inner coupled waveguide is guided by the p-type AlGaAs waveguide layer 6 in the vicinity of the end surfaces 40 and 42, i.e., in the region where waveguide layer 6 is not to be coupled with the undoped AlGaAs active layer 3. Thus, surface regions of the end surfaces 40 and 42 reflecting the laser light are defined by the p-type AlGaAs clad layers 4 and 7 and the p-type AlGaAs waveguide layer 6.

The p-type AlGaAs clad layers 4 and 7 and the p-type AlGaAs waveguide layer 6 are in Al composition ratios of, e.g., 45% and 35% respectively, which Al composition ratios are sufficiently larger in forbidden bandwidth than that of 9% of the undoped AlGaAs active layer 3. Thus, the p-type AlGaAs clad layers 4 and 7 and the p-type AlGaAs waveguide layer 6 are sufficiently larger in forbidden bandwidth than the undoped AlGaAs active layer 3, and hence the laser light emitted from the undoped AlGaAs active layer 3 is not absorbed in the vicinity of the end surfaces 40 and 42 at all. In other words, the so-called NAM (nonabsorbing mirror) structure is attained. Thus, the COD level is increased to prevent characteristic degradation caused by oxidation of the end surfaces 40 and 42 etc. facilitated by heat generation upon absorption of the laser light, thereby to implement an AlGaAs short wavelength semiconductor laser apparatus which can perform high-output operation with high reliability. According to this embodiment, furthermore, vertical and horizontal waveguide mechanisms are provided by the p-type AlGaAs waveguide layer 6 in the vicinity of the end surfaces 40 and 42, thereby to prevent lowering of the effective refractive index caused by expansion of the laser beam before reaching the reflective surfaces and astigmatism in which beam waist positions are different in the vertical and horizontal directions.

The semiconductor laser apparatus according to the aforementioned embodiment, which is manufactured by the MO-CVD method, cannot be formed by a liquid phase epitaxy method generally employed as a crystal growth method, since growth on AlGaAs layers is difficult in such a method. Description is now provided of another embodiment of the present invention, which can be formed by the liquid phase epitaxy method.

FIG. 4 is a fragmented perspective view showing a semiconductor laser apparatus having a coupled waveguide according to another embodiment of the present invention. FIG. 5 is a sectional view taken along the line A—A in FIG. 4, and FIG. 6 is a sectional view taken along the line B—B in FIG. 4.

Description of the structure of the semiconductor laser apparatus follows. Referring to FIGS. 4 to 6, an n-type GaAs substrate 1b is provided with a step 36 separated from an end surface 40, a step 37 separated from an end surface 42, a step 34 separated from an end surface 43 and a step 35 separated from an end surface 41, to define a stripe raised portion 33 in the n-type GaAs substrate 1b. The n-type GaAs substrate 1b is provided thereon with a p-type current blocking layer 5b except for the top portion of the stripe raised portion 33. An n-type AlGaAs clad layer 2b (composition ratio of Al to Ga is, e.g. 45% : 55%), an undoped AlGaAs active layer 3b (composition ratio of Al to Ga is, e.g., 9% : 91%), a p-type AlGaAs clad layer 4b (composition-ratio of Al to Ga is, e.g., 45% : 55%), a p-type AlGaAs waveguide layer 6b (composition ratio of Al to Ga is, e.g., 35% : 65%), a p-type AlGaAs clad layer 7b (composition ratio of Al to Ga is, e.g., 45% : 55%) and a p-type GaAs contact layer 8b are formed on the top portion of the stripe raised portion 33 and the p-type GaAs current blocking layer 5b in the said order. The n-type AlGaAs clad layer 2b and the p-type AlGaAs clad layer 4b are larger in forbidden bandwidth than the undoped AlGaAs active layer 3b respectively. The p-type AlGaAs waveguide layer 6b is larger than the undoped AlGaAs active layer 3b and smaller than the p-type AlGaAs clad layer 4b in forbidden bandwidth, and the p-type AlGaAs clad layer 7b is larger in forbidden bandwidth than the p-type AlGaAs waveguide layer 6b. The undoped AlGaAs active layer 3b and the p-type waveguide layer 6b are bent in portions obliquely above the steps 34, 35, 36 and 37 (the undoped AlGaAs active layer 3b is larger in bent degree), whereby the space between the undoped AlGaAs active layer 3b and the p-type AlGaAs waveguide layer 6b is narrower in a portion above the stripe raised portion 31 and wider in portions close to the end surfaces 40 and 42.

A brief description of a method of manufacturing the semiconductor laser apparatus follows. A mask of an $Si_3N_4$ stripe film disconnected at regular intervals is formed through photolithography on the n-type GaAs substrate 1b. Then the n-type GaAs substrate 1b is chemically etched through use of the mask to form the stripe raised portion 33. Thereafter Zn is diffused on the n-type GaAs substrate 1b to form the p-type GaAs current blocking layer 5b. Then the n-type AlGaAs clad layer 2b, the undoped AlGaAs active layer 3b, the p-type AlGaAs clad layer 4b, the p-type AlGaAs waveguide layer 6b, the p-type AlGaAs clad layer 7b and the p-type GaAs contact layer 8b are epitaxially grown successively through liquid phase epitaxy.

The semiconductor laser apparatus is similar in operating mechanism to the aforementioned embodiment, and the transverse mode of the laser light is stabilized since the undoped AlGaAs active layer 3b and the p-type AlGaAs waveguide layer 6b are bent. The laser light is guided by an inner coupled waveguide defined by a difference in refractive index between the n-type and p-type AlGaAs clad layers 2b and 4b and the undoped AlGaAs active layer 3b and a difference in refractive index between the p-type AlGaAs clad layers 4b and 7b and the p-type AlGaAs waveguide layer 6b on the stripe raised portion 33 to be guided only by the p-type AlGaAs waveguide layer 6b in the vicinity of the end surfaces 40 and 42 (because the undoped AlGaAs active layer 3b is extremely bent in portions above the steps 36 and 37 to substantially transmit no light at the said portions), thereby to attain NAM structure similarly to the embodiment as shown in FIGS. 1 to 3.

Although Al composition ratios of the active layers, the clad layers and the waveguide layers are 9%, 45% and 35% respectively in the embodiments as hereinabove described, the active layers, the clad layers and the waveguide layers may be in order Al composition ratios on condition that the said layers are related to each other similarly to the above in forbidden bandwidth, to attain effects similar to those of the aforementioned embodiments.

The present invention is also applicable to a semiconductor laser apparatus in which the layers as shown in FIGS. 1 to 4 are reversed in conductivity type.

Although the active layers are formed by undoped AlGaAs in the aforementioned embodiments, the same may be formed by n-type or p-type ones, to attain effects similar to those of the embodiments.

Further, although the active layers/clad layers/waveguide layers are formed by AlGaAs/AlGaAs/AlGaAs in the aforementioned embodiments, the same may be formed by InGaAsP/InGaP/InGaP, InGaAsP/InGaAsP/InGaAsP, InGaAsP/AlGaAs/AlGaAs, (AlGa)InP/AlGaAs/AlGaAs or (AlGa)InP/(AlGa)InP/(AlGa)InP, to attain effects similar to those of the embodiments.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor laser apparatus, having laser light outgoing end planes defining a resonator cavity therebetween, and two electrodes, comprising:
   a semiconductor substrate having a common surface with one of said electrodes, formed to have a first thickness with respect to said common surface adjacent said laser light outgoing end planes and a second thickness therebetween, said second thickness being larger than said first thickness, whereby a flat raised portion is defined in the substrate intermediate said end planes;

a first semiconductor clad layer of a first conductivity type formed on said semiconductor substrate;

a semiconductor active layer formed on said first semiconductor clad layer;

a second semiconductor clad layer of a second conductivity type formed on said semiconductor active layer, said first and second semiconductor clad layers each being selected to be larger in forbidden bandwidth than said semiconductor active layer;

a semiconductor waveguide layer formed on said second semiconductor clad layer, said semiconductor waveguide layer being selected to be larger than said semiconductor active layer and smaller than said second semiconductor clad layer in forbidden bandwidth; and a third semiconductor clad layer of said second conductivity type formed on said semiconductor waveguide layer, said third semiconductor clad layer being selected to be larger in forbidden bandwidth than said semiconductor waveguide layer, light emitted from said semiconductor active layer being guided by a coupled waveguide defined by difference in refractive index between said first and second semiconductor clad layers and said semiconductor active layer and difference in refractive index between said second and third clad layers and said semiconductor waveguide layer, said semiconductor active layer being formed so as to have a first separation from said semiconductor waveguide layer in the vicinity of laser light outgoing end planes and a second separation intermediate therebetween, said first separation being larger than said second separation to prevent coupling of laser light between said semiconductor active layer and said semiconductor waveguide layer in the vicinity of said laser light outgoing end planes.

2. A semiconductor laser apparatus in accordance with claim 1, wherein:

said second semiconductor clad layer has a larger thickness in portions thereof close to said laser light outgoing end planes that in a portion adjacent the center of said semiconductor substrate.

3. A semiconductor laser apparatus in accordance with claim 1, wherein:

said semiconductor active layer is formed to have nonplanar portions in the vicinity of said laser light outgoing end planes.

4. A semiconductor laser apparatus in accordance with claim 1 wherein:

said semiconductor substrate comprises GaAs;

said semiconductor active layer comprises GaAs; and said first, second and third semiconductor clad layers and said semiconductor waveguide layer respectively comprise mixed crystals of the three elements forming AlGaAs.

5. A semiconductor laser apparatus in accordance with claim 1, wherein:

said semiconductor active layer comprises mixed crystals of the four elements forming InGaAsP.

6. A semiconductor laser device in accordance with claim 1, wherein:

said semiconductor waveguide layer comprises mixed crystals of the four elements forming InGaAsP.

7. A semiconductor laser apparatus in accordance with claim 1, wherein:

said semiconductor substrate comprises GaAs;

said semiconductor active layer comprises mixed crystals of three elements of AlGaAs; and said first, second and third semiconductor clad layers and said semiconductor waveguide layer respectively comprise mixed crystals of the three elements forming AlGaAs.

8. A semiconductor laser apparatus in accordance with claim 1, wherein:

said semiconductor active layer comprises mixed crystals of the four elements forming (AlGa)InP.

9. A semiconductor laser device in accordance with claim 1, wherein:

said semiconductor waveguide layer comprises mixed crystals for the four elements forming (AlGa)InP.

10. The semiconductor laser apparatus of claim 2, wherein:

said waveguide layer is substantially unbent in its entirety in the direction extending between the end planes.

11. The semiconductor laser apparatus of claim 2, wherein the waveguide layer includes bent portions formed obliquely above the ends of the flat raised portion of the semiconductor substrate defined intermediate said end planes and wherein the refractive index of said waveguide layer is less than the corresponding index of the active layer.

* * * * *